United States Patent
Crain et al.

(10) Patent No.: US 6,813,209 B2
(45) Date of Patent: Nov. 2, 2004

(54) CURRENT INTEGRATING SENSE AMPLIFIER FOR MEMORY MODULES IN RFID

(75) Inventors: Ethan A. Crain, Cambridge, MA (US); Karl Rapp, Los Gatos, CA (US); Etan Shacham, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/685,371

(22) Filed: Oct. 14, 2003

(65) Prior Publication Data

US 2004/0136255 A1 Jul. 15, 2004

Related U.S. Application Data

(60) Provisional application No. 60/417,791, filed on Oct. 11, 2002.

(51) Int. Cl.[7] ........................... G11C 7/02; G01R 19/00; H03K 5/153; H03K 5/22
(52) U.S. Cl. .................. 365/208; 365/189.07; 365/192; 327/53; 327/61; 327/66
(58) Field of Search ....................... 366/189.07, 189.09, 366/192, 207, 208; 327/50–56, 61, 65–66

(56) References Cited

U.S. PATENT DOCUMENTS

| | | | | |
|---|---|---|---|---|
| 5,463,333 A | * | 10/1995 | Calder et al. | 327/78 |
| 6,265,962 B1 | * | 7/2001 | Black et al. | 340/10.2 |
| 6,642,804 B2 | * | 11/2003 | Chrissostomidis et al. | 331/143 |

* cited by examiner

*Primary Examiner*—VanThu Nguyen
(74) *Attorney, Agent, or Firm*—Cesari and McKenna, LLP; Edwin H. Paul, Esq.

(57) ABSTRACT

A low read current, low power consumption sense amplifier well suited for low frequency RFID systems is disclosed. An MOS transistor receives the read current from a memory cell, typically an EEPROM, and a current mirror is formed by a parallel MOS transistor. The mirror current is integrated on a capacitor after the charge on the capacitor is cleared via a reset pulse. A time period is defined during which the voltage on the capacitor is compared to a second voltage. The second voltage is formed from a reference voltage or from dummy cells, in either case the reference voltage is at about the logic boundary between a one and zero stored in a memory cell. A comparator, with or without input hysteresis, receives the voltage on the capacitor and a second voltage and within the time period, the output state of the comparator indicates the binary contents of the memory cell.

16 Claims, 5 Drawing Sheets

CURRENT INTEGRATING SENSE AMPLIFIER FOR MEMORY MODULES IN RFID

CROSS-REFERENCE TO RELATED APPLICATIONS

The present application claims the benefit of U.S. Provisional Application Ser. No. 60/417,791, which was filed Oct. 11, 2002, of common title, ownership and inventorship with the present application, and which application is hereby incorporated herein by reference.

FIELD OF THE INVENTION

The present invention relates to radio frequency identification (RFID) systems, and more particularly to sense amplifiers used in memory modules in RFID transponders.

BACKGROUND INFORMATION

Radio frequency identification (RFID) is well known using a wide range of base frequencies from about 100 KHz to about 13.5 MHz for passive and active transponders. A passive transponder derives power from the received signal and returns an identification signal. Active transponders contain a power source, typically a battery, and so does not derive power from the received signal. Accordingly, passive transponders require higher signal strength, while active transponders require much less signal strength, but at the cost of a power source.

FIG. 1 is a basic block diagram of an illustrative passive RFID system. Here an interrogation station 100 generates an RF signal 108, usually a pulse signal generated by the logic circuit 104, that is transmitted 110 via an antenna 112 to a transponder (tag) 102. The RF pulse is received via an antenna 114. The antenna 114 connects to an RF impedance matching circuit 116 and to an input/power circuit 118, with means to extract and store energy to power the tag system and means to processes the received signal. The RF signal 110 is rectified to charge a capacitor, not shown, used to power the tag system.

In the simplest RFID systems, the RFID transponder is a passive tag that extracts energy from the radiated wave, thereby providing a load on the RF transmitter. The loading is monitored at the interrogation station and indicates that a tag is present. In such a system there is no need to send any signal back to the interrogation system.

In more complex RFID systems, the transponder contains information that is transmitted back to the interrogation station. Such systems may be found on loading docks where tagged incoming freight, when interrogated, sends back to the interrogation station detailed information about the freight itself. For example, a box containing fragile crystal may inform the interrogation station of that fact. In such systems, referring to FIG. 1, when an RF interrogation signal is received, the input circuitry 118 will transfer the information to a logic circuit 120, typically a microcomputer. The microcomputer retrieves information from memory 126, typically an EEPROM (electrically erasable/programmable memory). The information is fed via a transmitter 122, to the antenna 114 and back 124 to the interrogation station. An EEPROM is used since it can be reprogrammed for other types of relevant information.

The contents of memory are read via a sense amplifier 128 that detects the ones or zeros contained in the memory cells. In such RFID systems, power must be conserved. High read currents and fast read times require high power consumption and generate undesirable noise.

In this document, a logic one is defined as a more positive voltage level and a zero as a less positive voltage level, sometimes called positive logic. It is well known that the logic one/zero designation is arbitrary and the less positive level may be deemed as a logic one, sometimes called negative logic. The present invention applies to both positive and negative logic designations, even if the language refers only to positive logic.

The Federal communications commission (FCC) regulates emissions, so prior art designs provide high power at short range but employ canceling techniques to comply with far range FCC regulations. Suitable techniques are known in the art and are not further discussed herein.

In U.S. Pat. No. 5,999,454 ('454), Smith discloses a current mode sense amplifier for flash memory. This patent and other prior art sense amplifiers referenced in this patent are designed for high speed operation and, so, are high powered. Such circuits generate noise and are, in turn, susceptible to noise problems and are not found in RFID systems.

There is need to minimize power consumption while reading the contents of RFID transponder memory cells. A tradeoff between read time and power dissipation can be made in RFID transponders operating in the lower baseband frequencies since fast read times and the concurrent high read currents are not necessary. Longer read times allow for relatively low read currents that reduce power dissipation and noise generation.

SUMMARY OF THE INVENTION

The present invention provides a system and method for reading a sense amplifier in an RFID transponder that operates at low speed and consequently consumes little power.

A first transistor, preferably and MOS type, receives the read current from a memory cell and a parallel transistor provides the mirror of that read current to a charge-storage capacitor. At the beginning of a READ cycle, the capacitor is first discharged. Subsequent mirrored read current then is directed to the capacitor and integrated over a given time period to produce a first voltage. (The capacitor may be a reverse-biased junction diode.)

A comparator circuit is used to compare the first voltage to a second or intermediate reference voltage. This reference voltage is set to lie between the level of a discharged charge-storage capacitor (defined level "zero") and the charged level corresponding to a defined level "one." This second or intermediate voltage may be set in a practical embodiment at about half way between the voltage established by off-state leakage of the memory transistor (zero) and the charged level representing a one.

In a preferred embodiment, a second reference memory cell is used to establish the intermediate voltage. A mirror of the read current from that second memory cell is integrated on a second capacitor forming a second voltage that is input to the comparator. To establish the intermediate reference voltage, several methods can be used. One method would utilize an always conducting reference memory cell, but of only a fraction of the "strength" or size ratio of the normal memory cells (e.g. using one-half of the channel width or, alternatively, twice the channel length.). A second method would use a full-size always conducting reference memory cell, but adjust the size ratio of the MOS transistors in the current-mirror circuit to reduce the reference voltage to an intermediate value.

In another preferred embodiment a full size or standard second and a third memory cell may be used together with full sized current mirrors and integrating capacitors. In this case the second memory cell is arranged to always output a high current while the third memory cell always outputs a low current. The high current representing a logic one and the low current a logic zero. By averaging the two integrated voltages from the second and the third memory cells the intermediate voltage is formed that tracks the midpoint between a one and a zero in the memory system.

In preferred embodiments, the time period for reading memory contents may range from below one microsecond to ten or more microseconds.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

This present invention discloses a current-mode sense amplifier for detecting the logic state of a memory device in Radio Frequency Identification (RFID) transponders. When a low base-band frequency, typical of many RFID systems, is employed, it permits relatively long integration times, which allow use of extremely low currents to read memory cells. Such low read currents provide low power dissipation and low noise contribution.

Figure 1:
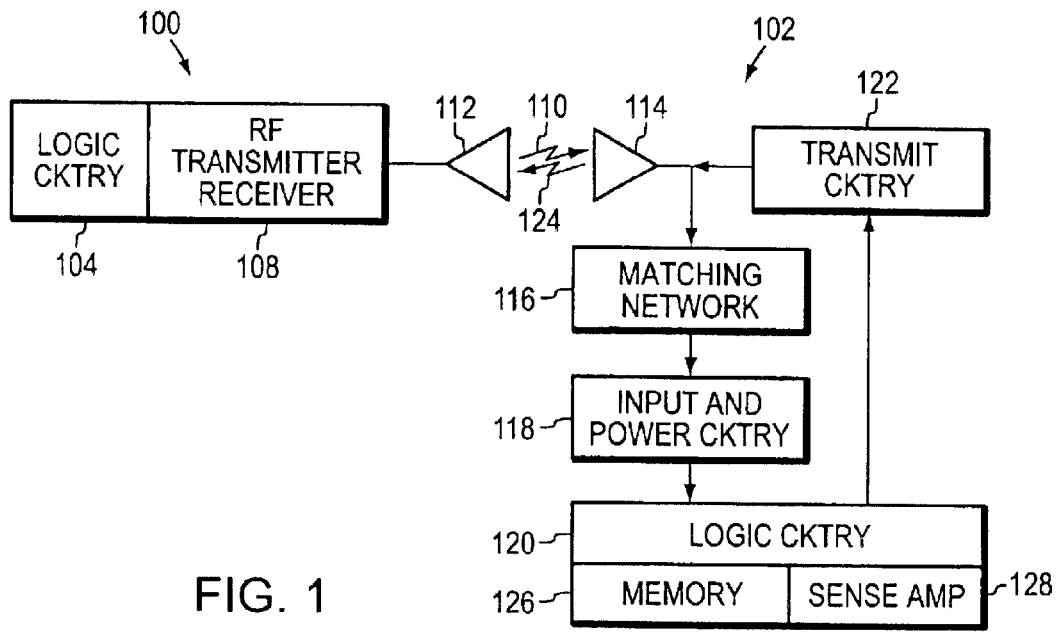
FIG. 1 is a system block diagram of an RFID system.
Figure 2:
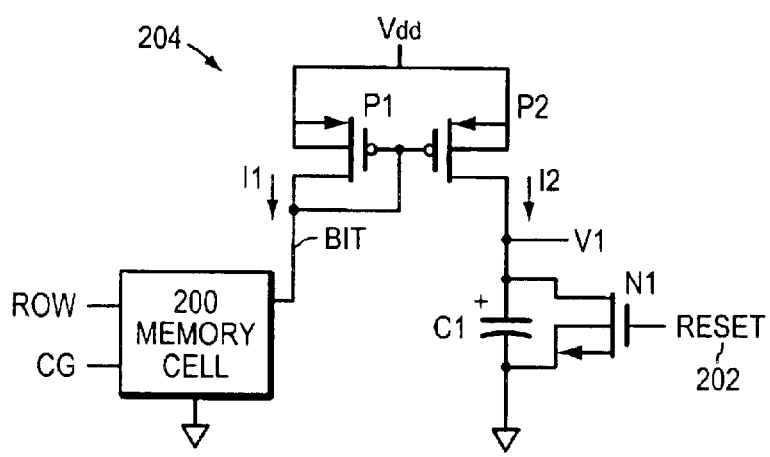
FIG. 2 is a circuit diagram of a memory and the first part of a preferred embodiment of the inventive current mode sense amplifier.

FIG. 2 is a circuit preferred embodying of the present invention. The output of the memory cell 200, Bit, is typically a drain (not shown) when the memory cell is a commonly used EEPROM. The cell 200 is read by activation of the ROW (select) and CG (control-gate) inputs to the cell, as common with such devices. The RESET signal may or may not be used with the memory cell depending on specific memory types. The present invention applies to virtually all such memory devices with different control designations. The Bit out is connected to the drain and gate of PMOS P1 and to the gate of PMOS P2. The drain and the gate of PI are connected together and its source is connected to a supply voltage Vdd. This wiring of an MOS device is sometimes referred to as a diode connected MOS transistor. PMOS P2 is connected as a current mirror of P1, where drain current I2 mirrors I1 in proportion to the relative strengths of P1 and P2. In one embodiment, P1 and P2 are of equal size and so I2 equals I1. The drain of the P2 is connected to the anode of an integrating capacitor C1, producing V1.

Still referring to FIG. 2, N1 is a transistor arranged to discharge C1 when RESET 202 is high. When RESET goes low, N1 is off, and I2 is allowed to charge C1.

Figure 3:
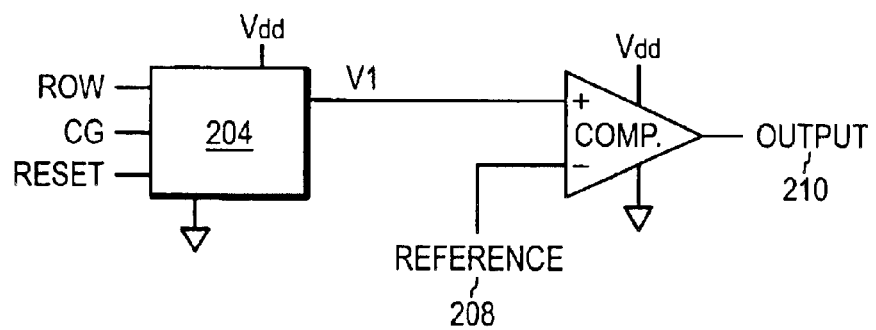
FIG. 3 is a block diagram of the circuit of FIG. 2 adding a comparator.

FIG. 3 shows the circuit of FIG. 2 as the memory cell 200 connected to the block 204, where V1, the voltage output from the integrating capacitor C1, is connected to the positive (+) input of a comparator 206. A reference voltage 208, often equal to about Vdd/2, is input to the negative (−) comparator input. This reference voltage in some applications may form the reference 207 input to other comparators for other memory cells. The comparator 206 compares one input to the other and provides an output indicating which input is higher than the other. For example, if the positive input is higher than the negative input, the output 210 of the comparator goes high, typically this indicates a logic one. Such comparators are well known in the art. The positive (+) and negative (−) designators on the comparator inputs may indicate other operations, but for this discussion when the (+) input exceeds the (−) input the output goes positive.

The charge on C1 is determined by the logic content of the memory cell over some time period T1, following a RESET pulse. In one preferred embodiment, if a logic one is read from the memory cell 200, the current I2 can charge C1 to a level that exceeds the reference voltage causing the output of comparator 206 to switch from a low to a high state. If the voltage on C1 crosses the threshold (exceeds the reference voltage 208) of the comparator 206 before sampling-gate time T1 expires, the comparator output 210 will switch high indicating a one in the memory cell. If a logic zero is read, C1 will stay relatively uncharged and the comparator output will remain in a high state. In one preferred embodiment the time T1 is about 5 to 10 microseconds. When T1 expires the RESET will be asserted clearing C1.

An improved embodiment of the comparator can optionally contain hysteresis both to sharpen the response to the relatively slow-moving voltages on the storage capacitors and to improve comparator noise immunity. As known in the art, a comparator with about equal inputs may oscillate, use of hysteresis will help, but other circuit techniques are known in the art to eliminate these types of problems.

Figure 4A:
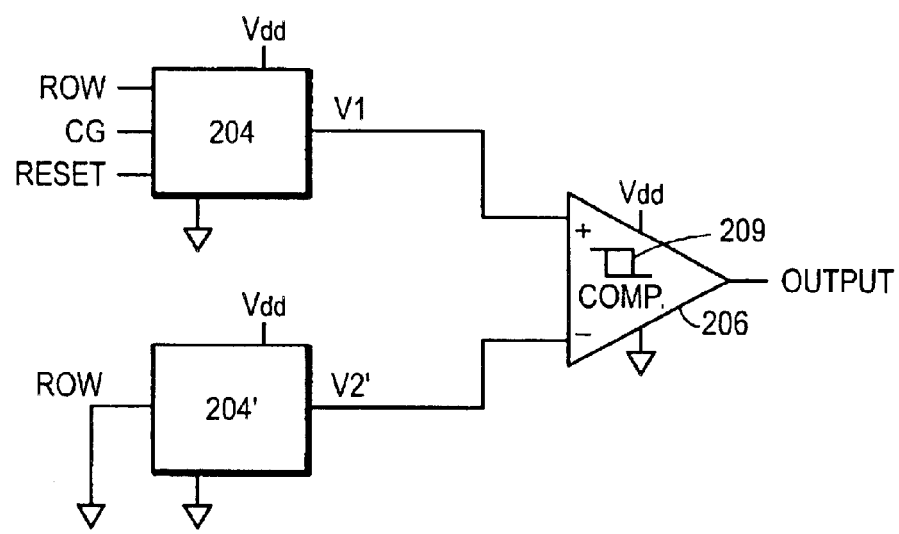
FIGS. 4A and 4B are block diagram schematics of other preferred embodiments of the invention.

FIG. 4A employs two memory cells and two mirror circuits 204 and 204' of FIG. 2. Here memory cell 200 and mirror circuit 204 represent an RFID information bit. The memory cell 200' and mirror circuit 204' are arranged to create the reference voltage 208 for the comparator 206. The inputs 230 to the memory cells 200' are arranged so that the memory cell 200' will always output a high current equal to a logic one. This current is mirrored and integrated onto the capacitor within the 204' block and presents a reference voltage 208 V2 to the negative input of the comparator 206. By controlling the relative sizes, as discussed, herein to control the conductances of PMOS transistors P1 in 204 and 204,' the integrated current (I2) in 204' can be set at a desired fraction of the magnitude of the integrated current I2 in 204. The reference voltage 208 at the negative terminal of the comparator thus can be controlled to establish the comparator trip point. Typically that trip point is set at a value representative of the mid-point between a one and a zero.

An alternative means for setting the comparator trip point can uses a current-mirror block 204 identical to the standard memory block, i.e. all component sizes are equal, except for the memory cell 200.' In this case, current scaling can be accomplished by using a dummy memory cell weaker than the standard memory cell 200. The ratio of conductance of the dummy memory cell to the standard cell 200 then will establish the desired reference voltage.

Yet another alternative means for setting the comparator trip point, the intermediate or reference voltage 208, is to use two standard dummy memory cells and mirror circuitry.

Figure 4B:
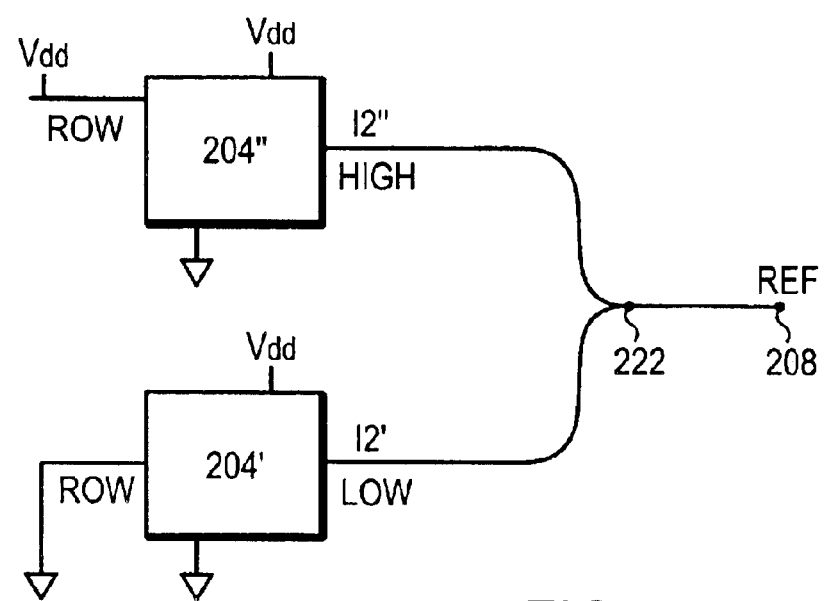

FIG. 4B shows this embodiment with two standard dummy memory cells 200' and 200" and standard current mirror blocks 204' and 204," respectively. Here, 200' and 204' are arranged to always output I2 equal to a low current, and 200" and 204" always outputs a high current. The outputs from the integrating capacitors from each mirror circuit are tied together 222 effectively forming a average of the voltages V1' and V1" that would have been presented from each cell individually. This average is connected to the reference input of the comparator 208.

Figure 5:
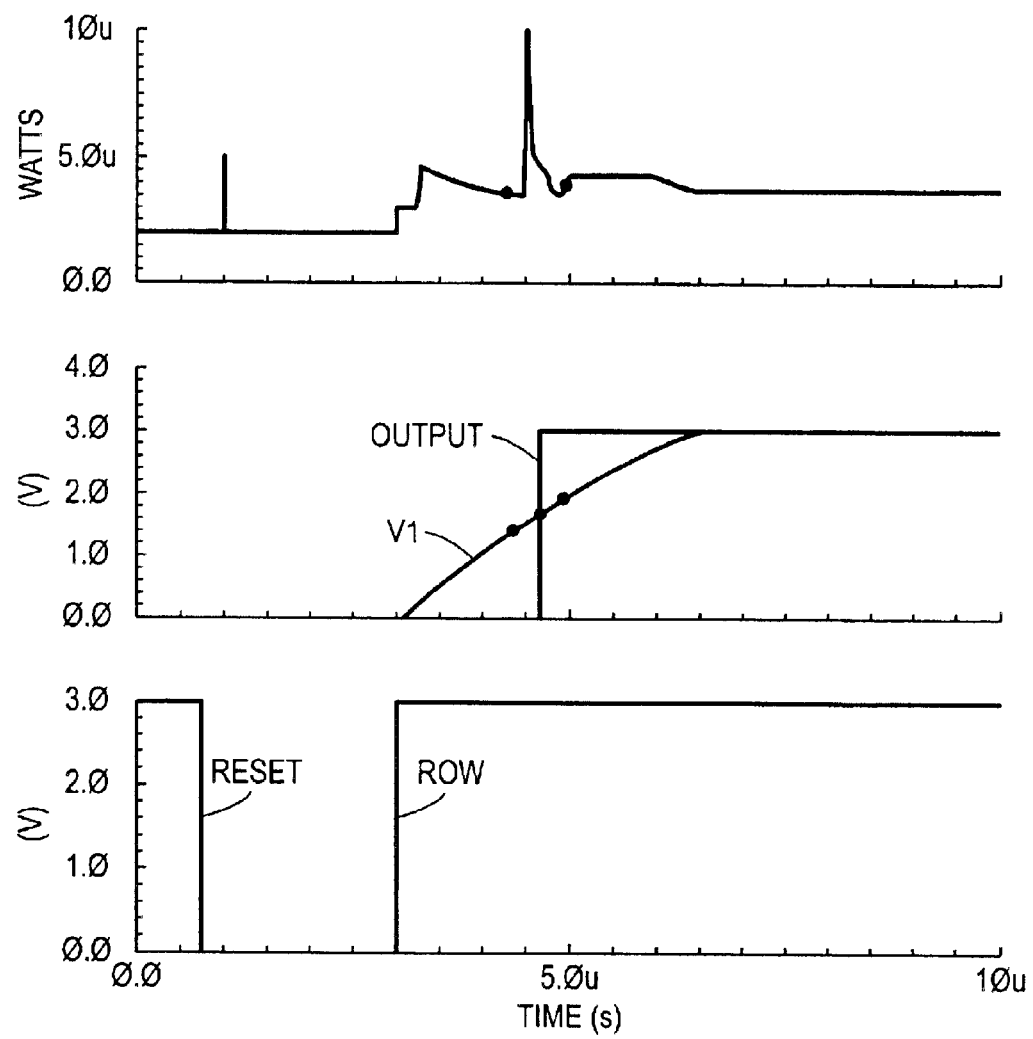
FIGS. 5 and 6 are time graphs of power and voltage signal found in the preferred embodiments of the present invention.
Figure 6:
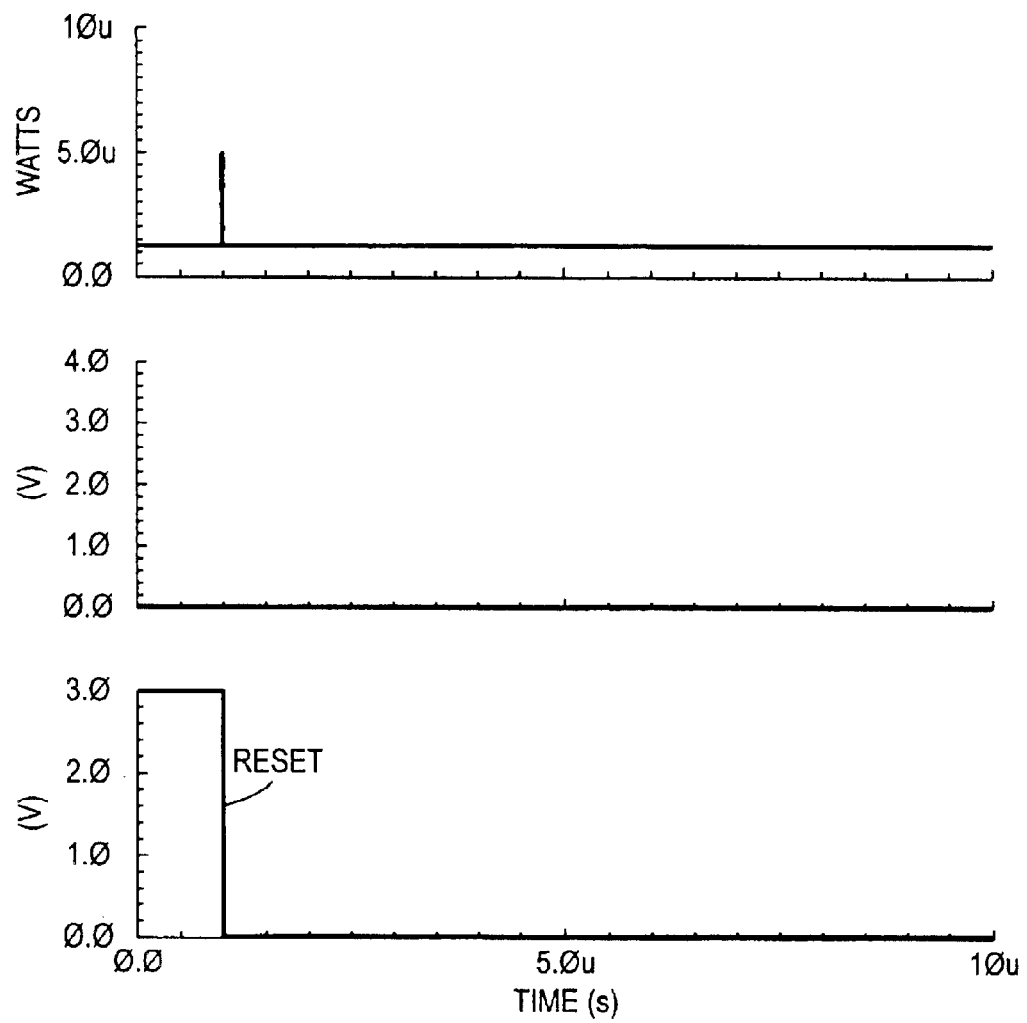

FIGS. 5 and 6 are traces of parameters for operation implementations of the present inventive sense amplifier shown in FIG. 3 with a +3V supply voltage. A 300 nA read current was used as the memory-cell 'one' current and 5 nA for the dummy-cell reference current. The reset signal initializes the integrating capacitors. In FIG. 5, the voltage V1 on the integrating capacitor C1 of cell 204 reaches a threshold of about 1.8 V whereupon the output of the comparator goes high. In this case indicating a logical one in the memory cell. The top trace represents the power consumption of the sense amplifier. FIG. 6 shows the same circuitry but where a zero is read from the memory cell. In this case V1 stays at about zero volts and the power consumption remains about constant. The average power dissipated during a read event under typical conditions is about 3.4 micro Watts reading a one with a 3 V supply.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A sense amplifier for reading the contents of a memory cell in a transponder in an RFID system comprising:
   a first transistor for receiving a read current from the memory cell,
   a second transistor arranged for mirroring the read current,
   a capacitor arranged to integrate the mirrored read current and provide a first voltage,
   means for resetting the capacitor after a time period,
   a second voltage,
   a comparator defining an output and first and second inputs, wherein the output is responsive to the relative voltage levels on the first and second inputs, the first input connected to the first voltage, and the second input connected to the second voltage, wherein the comparator output determines the content of the memory cell.

2. The sense amplifier of claim 1 wherein the second voltage is a voltage signal derived from reading the contents of a second memory cell.

3. The sense amplifier of claim 1 wherein the second voltage corresponds to a threshold defining the boundary between a logic one and zero read from the memory cell.

4. The sense amplifier of claim 1 further including hysteresis in the comparator input.

5. The sense amplifier of claim 1 further comprising:
   a second two transistor circuit for receiving, scaling and mirroring a second read current from a second memory cell,
   a second capacitor arranged to integrate the mirrored and scaled second read current and to provide a second voltage,
   means for resetting the second integrating capacitor after the time period,
   means for connecting the second voltage to the second input of the comparator.

6. The sense amplifier of claim 1 further comprising:
   a second two transistor circuit for receiving and mirroring a second read current from a second memory cell,
   means for scaling the read current from the memory cell,
   a second capacitor arranged to integrate the mirrored and scaled second read current and to provide a second voltage,
   means for resetting the second integrating capacitor after the time period,
   means for connecting the second voltage to the second input of the comparator.

7. The sense amplifier of claim 1 further comprising:
   a second two transistor circuit for receiving and mirroring a second read current from a memory cell arranged to output a low read current,
   a second capacitor arranged to integrate the mirrored second read current and provide a second voltage,
   a third two transistor circuit for receiving and mirroring a third read current from a memory cell arranged to output a high read current,
   a third capacitor arranged to integrate the mirrored third read current and provide a third voltage,
   means for resetting the second and the third integrating capacitors after the time period,
   means for averaging the second and third voltages together and connecting the averaged voltage to the second input of the comparator.

8. The sense amplifier of claim 7 wherein the means for averaging the second and third voltages is means for connecting them together.

9. The sense amplifier of claim 1 where the time period is more than about one microsecond.

10. A method for reading the contents of a memory cell in a transponder in an RFID system comprising the steps of:
    receiving and mirroring the read current from the memory cell,
    integrating the mirrored current on a capacitor thereby providing a first voltage,
    resetting the capacitor after a time period, and
    comparing the first voltage to a second-voltage, and providing an output therefrom, wherein the output determines the logic content of the memory cell.

11. The method of claim 9 wherein the second voltage is a voltage derived from reading the contents of a memory cell.

12. The method of claim 9 wherein the second voltage corresponds to a threshold defining the boundary between a logic one and logic zero read from the memory cell.

13. The method of claim 9 wherein the step of comparing including providing hysteresis with respect to the switching of the comparator.

14. The method of claim 9 further comprising the steps of:
    receiving, scaling and mirroring a second read current from a second memory cell,
    integrating the mirrored second read current on a second capacitor and providing a second voltage,
    resetting the second integrating capacitor after the time period, and
    connecting the second voltage to the second input on the comparator.

15. The method of claim 9 further comprising:
    receiving and mirroring a second read current from a memory cell arranged to output a low read current, integrating the mirrored second read current on a second capacitor and providing a second voltage, receiving and mirroring a third read current from a memory cell arranged to output a high read current, integrating the mirrored third read current on a third capacitor and providing a third voltage, resetting the second and the third integrating capacitors after the time period, averaging the second and third voltages together and connecting the averaged voltage to the second input of the comparator.

16. The method of claim 9 further comprising the step of setting the time period to be greater than about one microsecond.

* * * * *